United States Patent [19]

Kusakabe

[11] 4,117,407
[45] Sep. 26, 1978

[54] FREQUENCY SYNTHESIZER TUNER

[75] Inventor: Hiromi Kusakabe, Yokohama

[73] Assignee: Tokyo Shibaura Electric Co., Ltd., Kawasaki, Japan

[21] Appl. No.: 681,698

[22] Filed: Apr. 29, 1976

[30] Foreign Application Priority Data

| Apr. 30, 1975 | [JP] | Japan | 50-52337 |
| Apr. 30, 1975 | [JP] | Japan | 50-52341 |
| Apr. 30, 1975 | [JP] | Japan | 50-52346 |
| Jul. 18, 1975 | [JP] | Japan | 50-52356 |
| Jul. 18, 1975 | [JP] | Japan | 50-87919 |

[51] Int. Cl.$^2$ ............................................. H04B 1/06
[52] U.S. Cl. ................................. 325/455; 325/468
[58] Field of Search ............................. 325/419–421, 325/423, 452, 453, 455, 457–459, 464, 465, 468–470; 331/1 A; 334/14–16, 86

[56] References Cited

U.S. PATENT DOCUMENTS

| 3,714,585 | 1/1973 | Koch | 325/468 |
| 3,748,645 | 7/1973 | Kawashima | 325/465 |
| 3,803,494 | 4/1974 | Howell et al. | 325/469 |
| 3,883,807 | 5/1975 | Alberkrack | 325/420 |
| 3,898,579 | 8/1975 | Aldridge | 331/1 A |
| 3,961,261 | 6/1976 | Pflasterer | 325/470 |
| 3,962,644 | 6/1976 | Baker | 325/455 |
| 4,023,107 | 5/1977 | Tanaka | 325/468 |

Primary Examiner—Robert L. Griffin
Assistant Examiner—Jin F. Ng
Attorney, Agent, or Firm—Oblon, Fisher, Spivak, McClelland & Maier

[57] ABSTRACT

The frequency synthesizer tuner is constituted by a dynamic shift register including first and second shift registers connected in a loop, wherein an information is written into and read out of the dynamic shift register and circulated therethrough by clock pulses, an output circuit including a display unit and a frequency synthesizer to which the information read out of the first shift register is supplied through a latch circuit, and a memory circuit connected in parallel with the latch circuit, a transfer circuit connected between the first and second shift registers, a refresh circuit connected between the output circuit and the second shift register, and a keyboard and a keyboard input circuit for applying an input information to the first shift register.

7 Claims, 16 Drawing Figures

FIG. 9
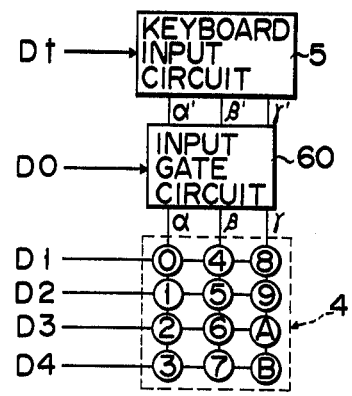
FIG. 10
FIG. 11
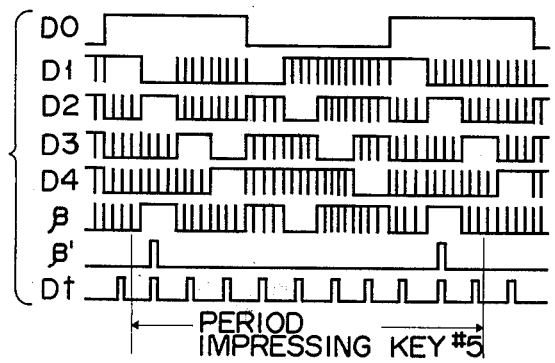

F I G. 14
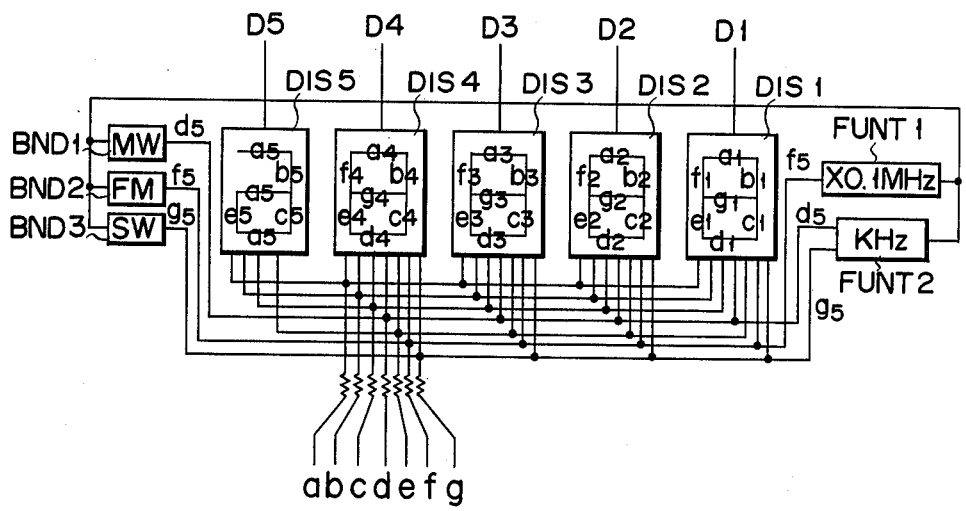
F I G. 15
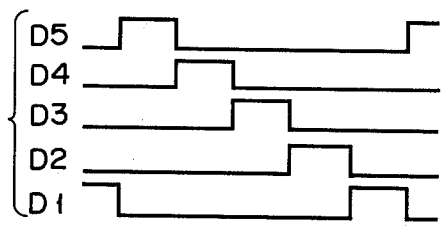

FREQUENCY SYNTHESIZER TUNER

This invention relates to a frequency synthesizer tuner constituted by a dynamic shift register.

A frequency synthesizer tuner utilized in a radio receiver, for example, is generally constituted by a frequency synthesizer, a frequency memory device, a variable tuning device, a memory read-write device, an off band detector, an input-output circuit, etc. Prior art frequency synthesizer tuner has generally been of the so-called static type. The reason is that, firstly since the tuner is constituted by universal digital integrated circuits such as SSI and MSI, the tuner is inherently of the static type. Secondary, the static type is easier to design than the dynamic type. When one tries to form a frequency synthesizer tuner by using an LSI (large scale integrated circuit) the static type requires a large number of circuit elements and complicated wirings thereby greatly limiting the functions of a tuner that can be formed on a single chip.

Accordingly, it is an object of this invention to provide an improved frequency synthesizer tuner constructed to reduce the number of circuit elements and wirings required for fabricating the tuner with an LSI.

According to this invention, there is provided a frequency synthesizer tuner comprising a dynamic shift register including first and second shift registers connected in a loop, wherein an information is written into and read out of the dynamic shift register and circulated therethrough by clock pulses, an output circuit including a display unit and a frequency synthesizer to which the information read out of the first shift register is supplied through a latch circuit, a memory circuit connected in parallel with the latch circuit, a transfer circuit connected between the first and second shift registers, a refresh circuit connected between the output circuit and the second shift register, and a keyboard and a keyboard input circuit for applying an input information to the first shift register.

This invention can be more fully understood from the following detailed description when taken in conjunction with the accompanying drawings, in which.

Figure 12:
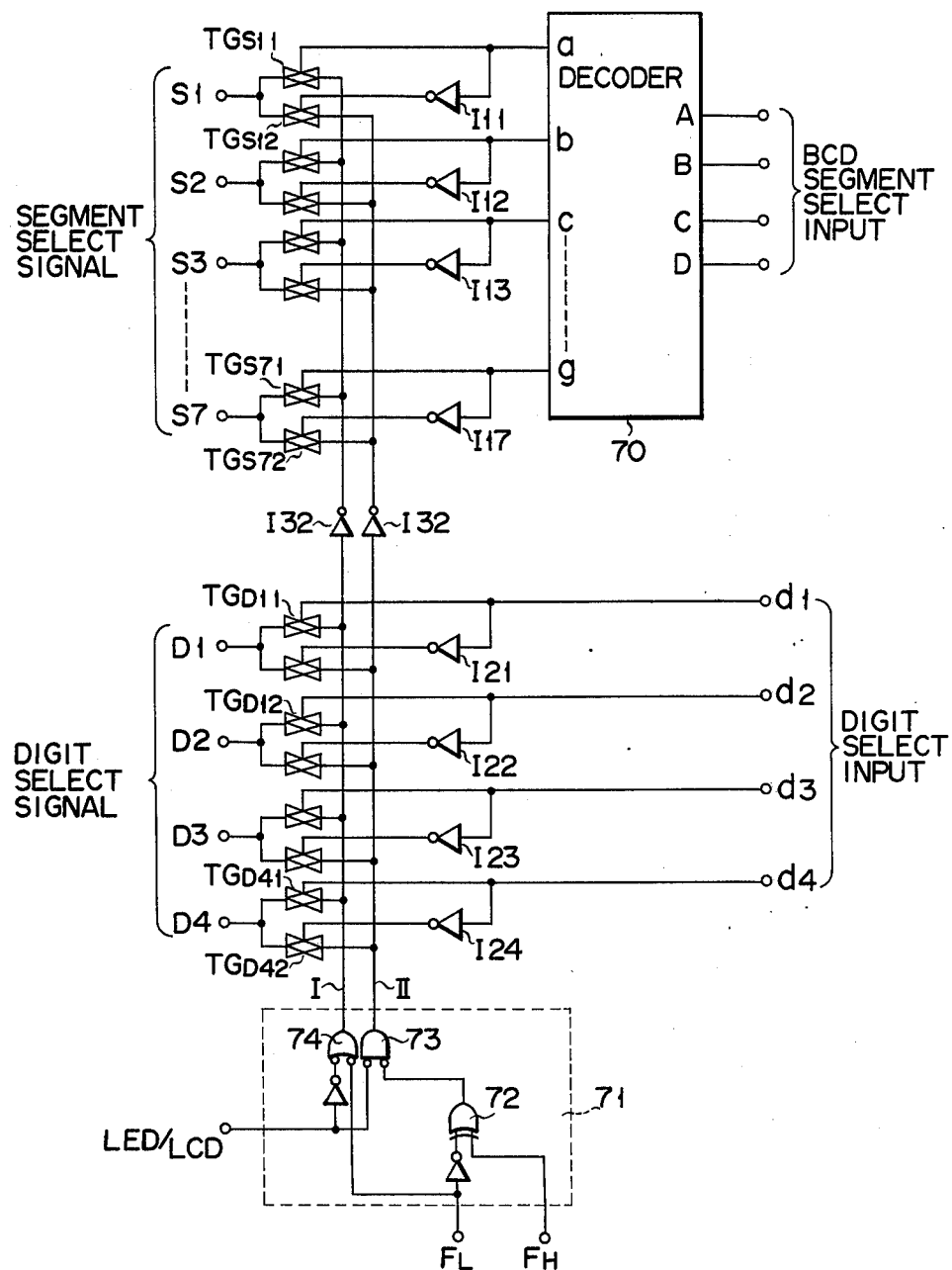
Figure 13:
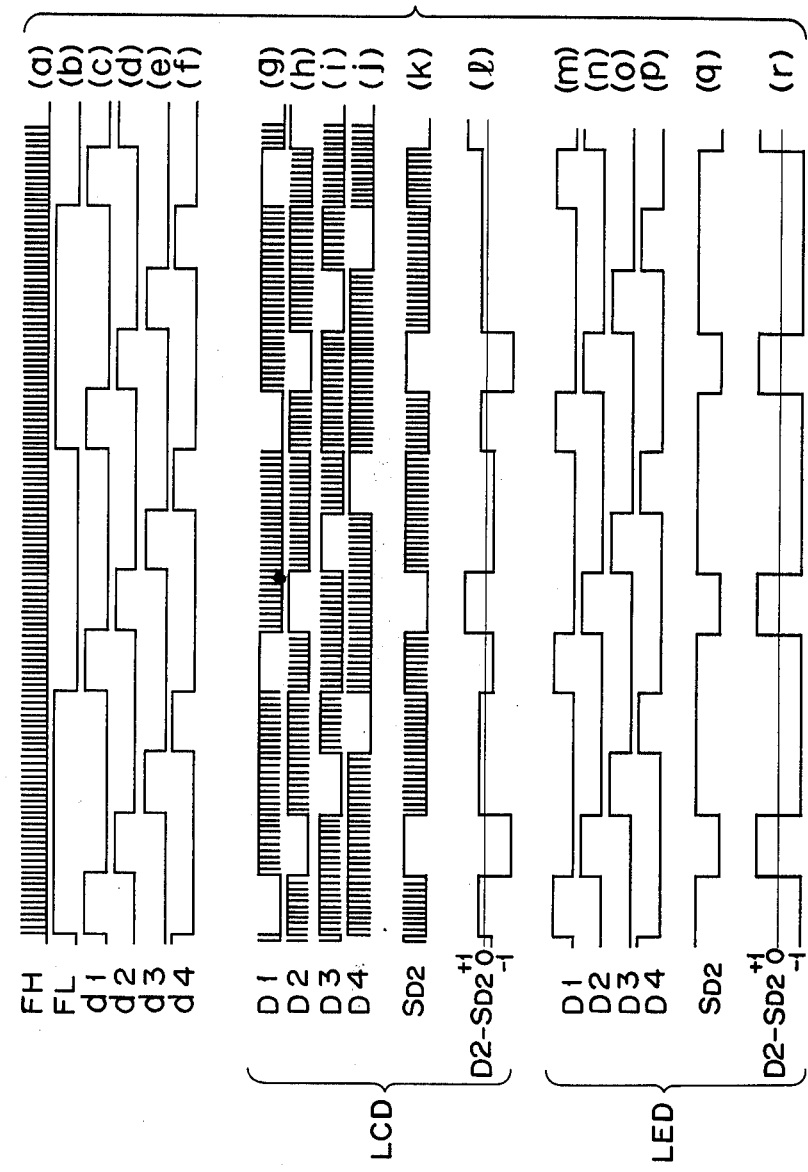

FIGS. 9(a) and 9(b) are tables showing the correspondence between the decimal numerals and the binary code digits;

FIG. 10 shows the detail of a modified keyboard;

FIG. 11 shows the waveforms of digit selection signals applied to the keyboard shown in FIG. 10;

FIG. 12 shows a connection diagram of an improved display unit driving circuit which can be used either for a DC driving system or an AC driving system for the display unit;

FIG. 13 shows waveforms of various signals useful to explain the operation of the circuit shown in FIG. 12;

FIG. 14 is a block diagram showing a modified display unit; and

FIG. 15 shows waveforms of digit selection pulses utilized to drive the display unit shown in FIG. 14.

In an LSI utilizing an MOS element, so-called dynamic type system is used, wherein use is made of an extremely high input impedance thereof for temporally storing an electric charge in the input capacitance thereof thereby performing logical operations. According to such dynamic type system the number of elements can be greatly reduced. Thus, for example, considering one stage of a shift register, the static type requires 10 elements, whereas the dynamic type requires only four elements. In other words, it is possible to make a small chip to have twice or more functions. According to this invention a great deal of information having received frequencies are serially stored in a dynamic type shift register and the information is caused to cyclically circulate through a loop by a clock pulse, and the arrangement of the information, the positions at which the information is written and read, and the method of transferring the information are improved such that writing, reading and digit shifting can be made readily.

The invention will now be described with reference to FIGS. 1 through 6. The circuits shown in FIGS. 1 and 2 are operated by the output from a timing pulse generating circuit 1 shown in FIG. 3 which generates timing pulses as shown in FIG. 4.

Figure 3:
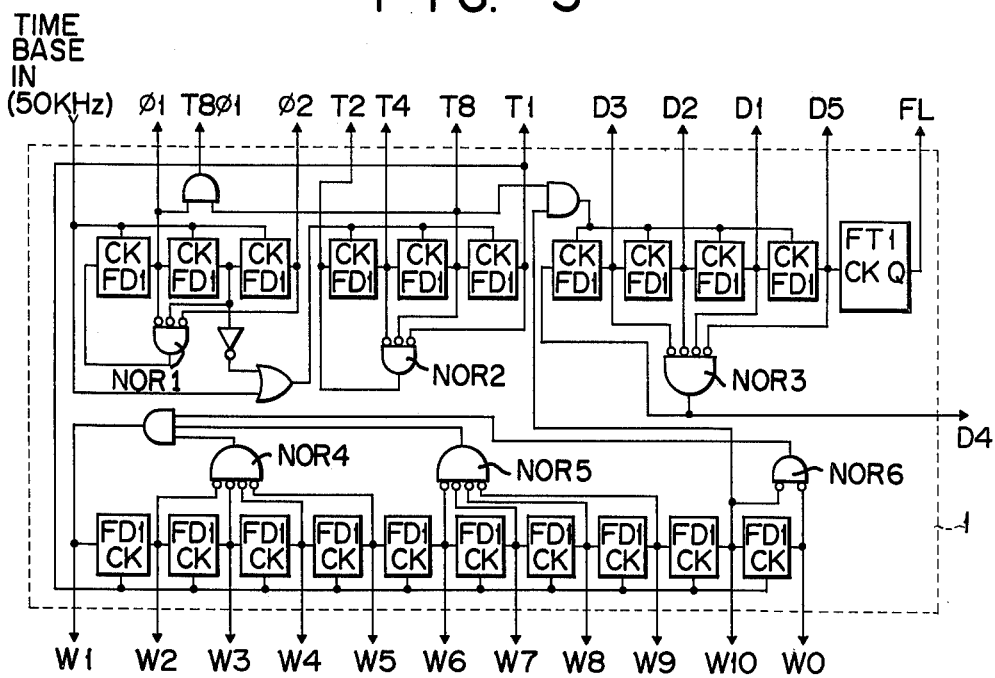
FIG. 3 is a block diagram showing one example of a timing pulse generating circuit.
Figure 4:
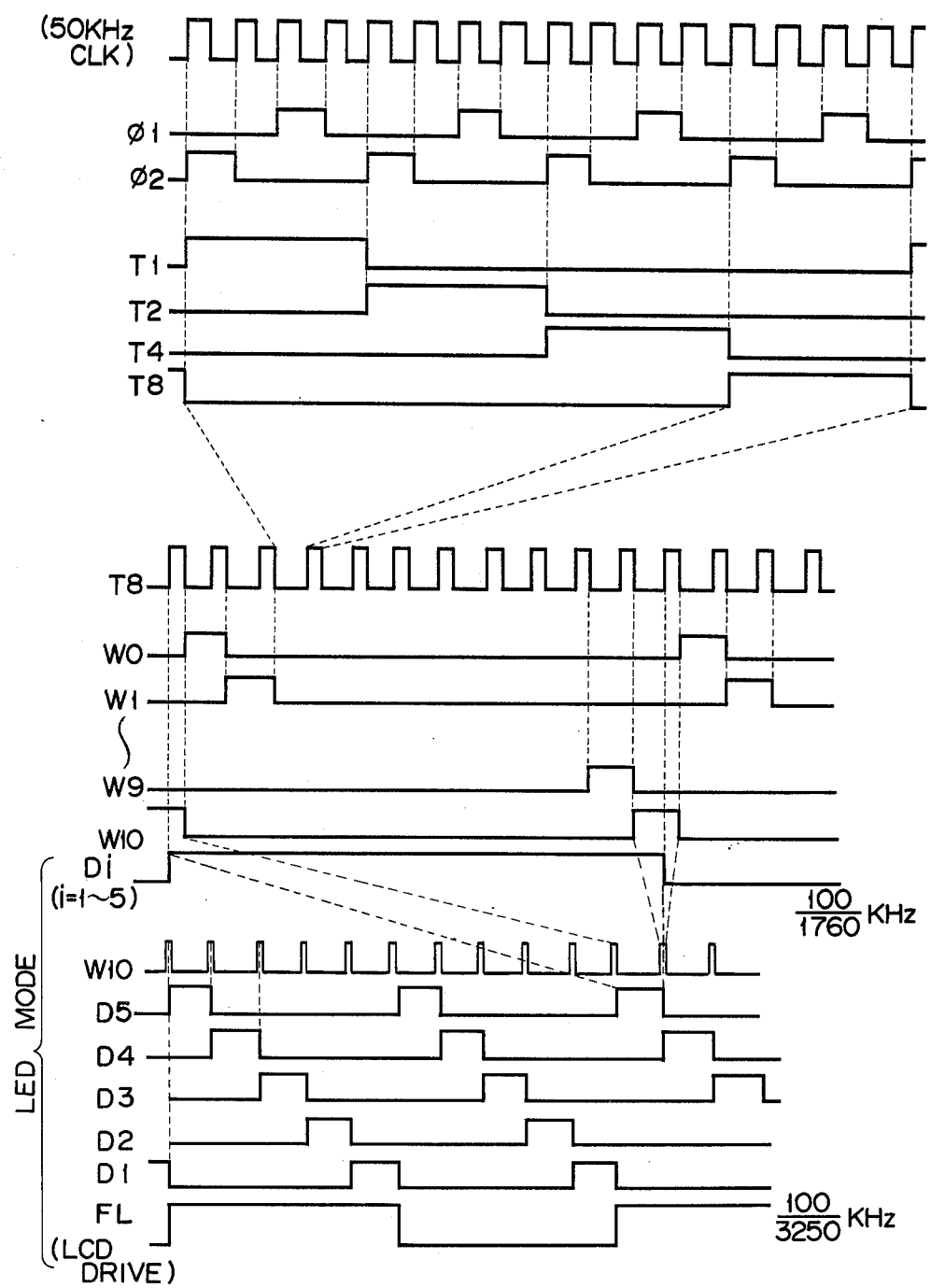
FIG. 4 shows various timing pulses generated by the timing pulse generating circuit shown in FIG. 3.

The timing pulse generating circuit 1 shown in FIG. 3 comprises a counter constituted by a plurality of delayed type (D-type) and toggle type (T-type) flip-flop circuits FD1 and FT1 adapted to count a number of input clock pulses having a frequency of 50 KHz, for example, and a number of logical circuits. The counter takes the form of a ring counter in which information is circulated through NOR gate circuits NOR-1 to NOR-6 for the purpose of eliminating spikes at the time of decoding. Since the construction of such timing pulse generating circuit is well known in the art, its detailed description is believed unnecessary.

Among various outputs from the timing pulse generating circuit 1, $\phi 1$ and $\phi 2$ represent two phase clock pulses for operating a dynamic shift register 3 (FIG. 1) comprising shift registers 2a, 2b, 2c and utilized as a memory device, the clock pulse $\phi 1$ serving to write data and clock pulse $\phi 2$ to read out data. D1 through D5 are digit selection pulses supplied to the digit driver 16a of a display unit 16. Pulses D1 through D5 are also used as the timing pulses for a keyboard 4. As shown in FIG. 4, word pulses W0 through W10 are generated in the pulse widths of respective pulses D1 through D5. Each word corresponds to one of four registers provided in the shift register 3, and each word comprises four bits. This represents one of the decimals of a corresponding digit. Upon application of a pulse to a TIME BASE IN terminal, the number of pulses is counted by a register selected by the word pulse W0 which counts the first digit (10 steps), the second digit (6 steps), third and fourth digits (24 steps). The register selected by the word pulse W0 receives data key-input during the MAN (manual) mode and data read out of the memory device 11 during the RCL (recall) mode. The frequency display during the TUNER mode and the input to a programable frequency divider of the frequency synthesizer that designates the ratio of frequency division are performed by the count of the register corresponding to the word pulse. The flip-flop circuit FT1 produces an output FL at each two cycles of the digit pulse and having a duration of one cycle thereof. The output FL is used to drive a liquid crystal display element by alternating current.

Figure 1:
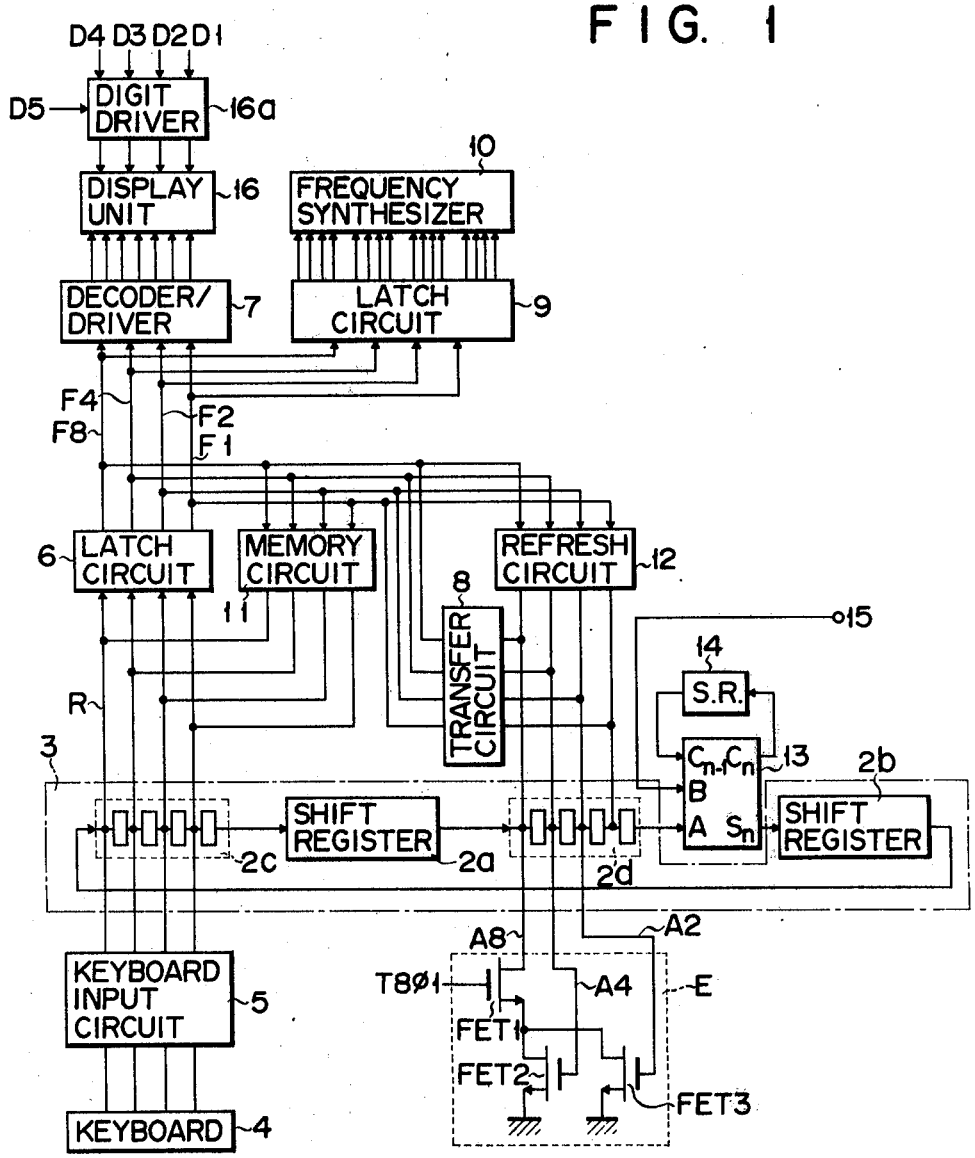
FIG. 1 is a block diagram showing one embodiment of this invention.
Figure 2:
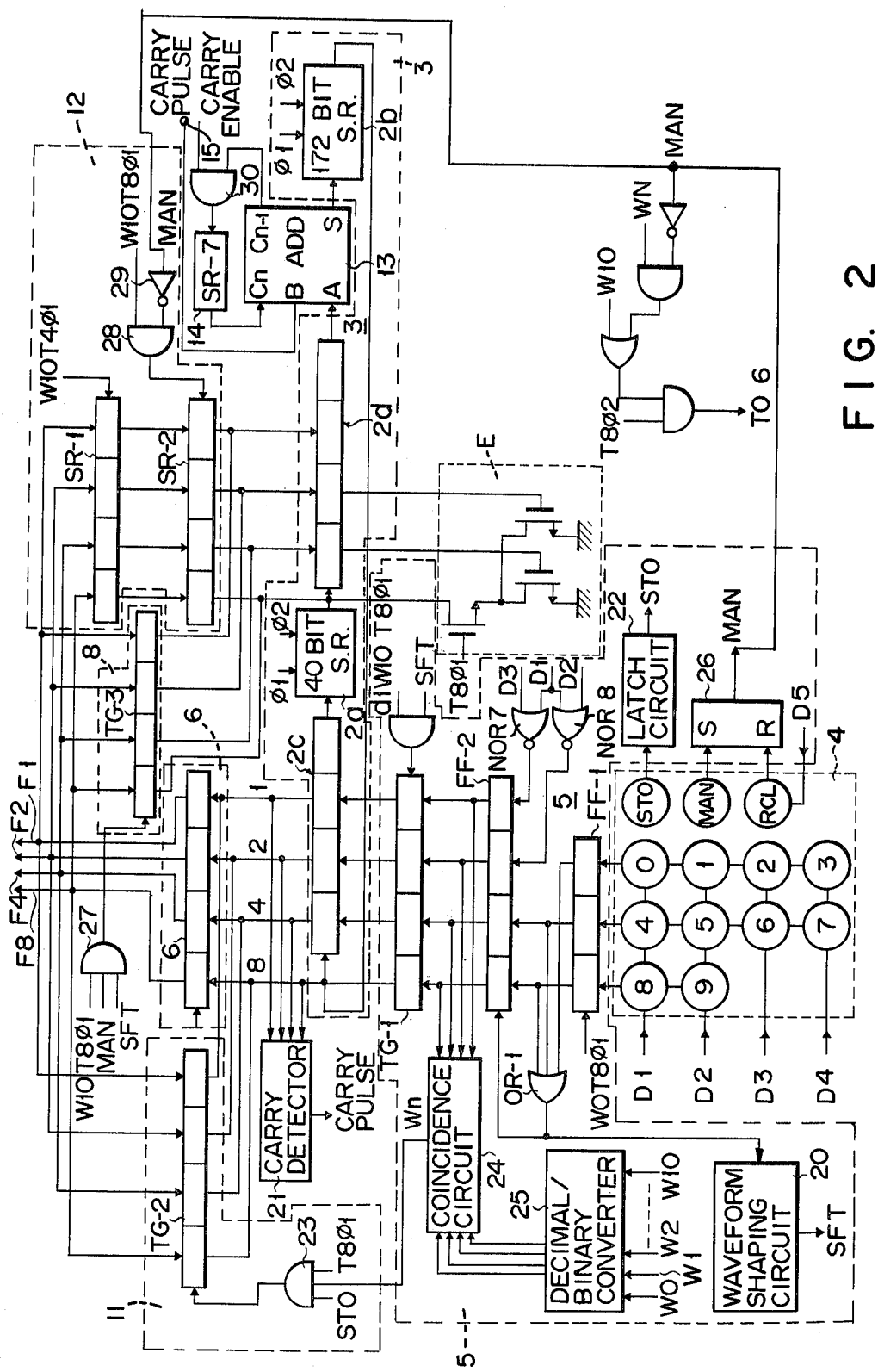
FIG. 2 is a block diagram showing the detail of the main part of the circuit construction of the embodiment shown in FIG. 1.
Figure 5:
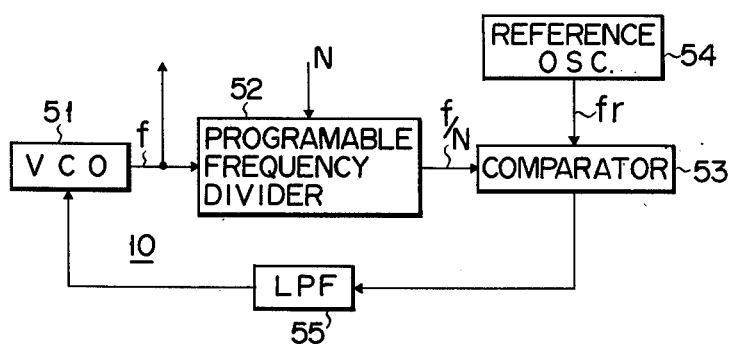
FIG. 5 is a block diagram showing one example of a frequency synthesizer shown in FIG. 1.

Turning now to FIG. 5 which shows a typical frequency synthesizer 10 shown in FIG. 1, the output frequency f from a voltage controlled oscillator 51 is applied to a programable frequency divider 52 in which its frequency is divided into $f/N$ by a program input N. The output $f/N$ from the frequency divider 52 is coupled to a frequency-phase comparator 53 and its frequency and phase are compared with the reference frequency $fr$ generated by a reference oscillator 54 and applied to the comparator 53. Accordingly, comparator 53 produces an output corresponding to the difference between the frequencies of the two inputs, and this output is applied to the voltage controlled oscillator 51 via a low pass filter 55, thus forming a so-called phase locked loop. The output from the comparator 53 controls the output frequency of the voltage controlled oscillator 51 such that input frequencies $f/N$ and $fr$ coincide with each other, and the comparator 53 is synchronized when a relation $f=N\cdot fr$ is satisfied. Thus, the output frequency $f$ can be set to any desired value by varying the program input N.

In FIG. 4, T1, T2, T4 and T8 respectively represent bit pulses in which each one word comprises four bits and contains the digital data of frequency. In this example, one digit comprises 11 words W0 to W10 constituting 44 bits which correspond to 11 channels, and there are five digits D5, D4, D3, D2 and D1. The circuit is constructed such that the timings of the rise up and fall down of the digit pulses coincide with the rise up of a timing pulse (W10 to T8$\phi$2) which represents a logical product of pulses W10, T8 and $\phi$2 as shown in FIG. 4 for the purpose of making easy the dynamic drive of the display unit 16. The reference point of the timing is shown by a point R in FIG. 1.

Shift registers 2c and 2d are located at different positions in the dynamic shift register 3, and the difference between their operating timings is selected to be equal to one digit. In this example, since 1 digit comprises 11 words or 44 bits, shift registers 2c and 2a are constructed such that the sum of their bits will be equal to 44 bits. In other words, the shift register 2c has four bits and 2a has 40 bits. Further, as the total sum of the bits is equal to 44 bits $\times$ 5 digits = 220 bits, the number of the bits of the shift register 2d is four and 2b should be 172. The keyboard 4 comprises numeral keys 0 to 9 and function keys STO, MAN and RCL. The function key MAN is for inputting numeral data, RCL for recalling a desired one of channels 0 to 9, and STO for storing to a desired channel a frequency input in the MAN mode.

The keyboard 4 operates to input numerals as follows. Generally speaking when a key representing a data N is depressed the output from flip-flop circuit FF-1 comprising D flip-flop circuits as shown in FIG. 2 is obtained at a timing of W0T8$\phi$1. For example, if N=5, the output of the bit element at the center of the flip-flop circuit FF-1 becomes "1" at the timing of a digit pulse D2 and at substantially the same time, the output from a three input OR gate circuit OR-1 becomes "1" so that data will be stored in a flip-flop circuit FF-2. The value of this data is $(0101)_2$, that is $(5)_{10}$ of a code 8-4-2-1, the code 2-1 is produced by signals D1, D2 and D3 supplied from the timing pulse generating circuit 1 via NOR gate circuits NOR7 and NOR8, but since the timing of the operation of a D-type flip-flop circuit FF-2 is determined by the data on the keyboard 4 there is no trouble. Another numeral data also can easily be obtained by using the above-mentioned arrangement. According to this system, the keyboard input circuit 5 can be greatly simplified. While the key is being depressed the clock input to the flip-flop circuit FF-2 is maintained at "1" state no input is applied even when another key is depressed. Accordingly, it is possible to perfectly prevent misoperations caused by simultaneous depression of a plurality of keys.

In the MAN mode, the data which has been stored in the flip-flop circuit FF-2 is written in the shift register W10 of the dynamic shift register 3 by opening a transfer gate TG-1 by a shift signal SFT at a timing of $d$1W10T8$\phi$1. The shift signal SFT is produced by shaping the waveform of the output of OR gate circuit OR-1 by a waveform shaping circuit 20 so that the shift signal is generated once at a predetermined timing when a numeral key is depressed. As described above, the data is written in the dynamic shift register 3 at the timing of the clock pulse $\phi$1 and as the data is read out at the timing of the clock pulse $\phi$2.

By latching the outputs F1, F2, F4 and F8 of the latch circuit 9 to the frequency synthesizer 10 and to the display unit 16 via the decoder 7 by a latch circuit 6 at a timing of W10T8$\phi$2, the data from the shift register 2c can be obtained as the output of four bit slices in the order of D5, D4, D3, D2 and D1.

The output from the transfer gate circuit TG-1 is applied to a carry detector 21 and to another transfer gate. When a store key STO and a key corresponding to numeral N are depressed at the same time, an output signal STO from a latch circuit 22 connected to the store key STO will be applied to one input of a 3 input AND gate circuit 23 having a second input connected to receive a pulse W$n$ ($n$=D to 9) from the coincidence circuit 24, the pulse W$n$ being generated at a timing corresponding to the depression of the numeral key N. The coincidence circuit 24 is connected to receive a signal corresponding to the numeral key N from the flip-flop circuit FF-2 for comparing the received signal with word pulses W0 through W10 which have been converted into binary forms by a decimal/binary converter 25. Upon coincidence of the input signals, the coincidence circuit 24 produces a word pulse W$n$ corresponding to numeral N. Since the third input of the AND gate circuit 23 is supplied with pulse T8$\phi$1, this AND gate circuit 23 produces an output that enables the memory circuit 11 at a timing of W$n$T8$\phi$1, whereby data from latch circuit 6 is written through the memory circuit 6 into the shift register 2c in the shift register 3. In these operations, since the data are processed serially by the dynamic system, it is possible to decrease the number of the circuit elements.

The transfer gate circuit TG-3 is used as the transfer circuit 8 for the purpose of shifting one digit the numeral displayed towards left (more significant digit) when a numeral key is depressed in the MAN mode. This manual (MAN) mode operation is performed by operating the manual key MAN on the keyboard 4 to set flip-flop circuit 26 thereby applying the signal MAN to the transfer gate circuit TG-3 at the timing of W10T8φ1 through the AND gate circuit 27 together with signal SFT. Since the contents of shift registers 2c and 2d are shifted one digit the transfer of the data is possible using the transfer gate TG-3 alone.

When a recall key RCL of the keyboard 4 is depressed to reset the flip-flop circuit 26 and the manual signal becomes "0" and the data is read out from a desired position Wn of the dynamic shift register loop with the recall (RCL) mode, the two shift registers SR-1 and SR-2 operate to latch at a clock timing WnT82φ for the latch circuit 6 whereby data is written in the shift register SR-1 at a timing of W10T4φ1 and written in the shift register 2d through the shift register SR-2 at a timing of W10T8φ1. The MAN signal is applied to one input of the AND gate circuit 28 through an inverter 29 so that these operations are performed under the recall (RCL) mode.

An adder 13 connected between shift registers 2d and 2b is constructed to operate as one step shift up/down counter. A shift register 14 is provided to delay the carry output carry (CAR) by one bit that is to add to a digit at one order higher. Thus, the shift register 14 clears the original digit at the position of the shift register 2c when a carry up is made. During the down mode operation a subtraction operation should be made but a complement $(1111)_2$ that is $(15)_{10}$ is added thus ignoring the carry operation of the most significant digit. Thus, $(9)_{10}$ or $(1001)_2$ should be written without clearing the original digit (decimal). Though not shown, the position in which $(1001)_2$ is written in may be between shift registers 2c and 2a.

To designate the receiving frequency by the keyboard 4, it is necessary to perform the key operation described above in accordance with a predetermined frequency. For example, to designate a frequency of 825 Hz, numeral 8 key is firstly operated, so that "8+ signal, that is "1, 0, 0, 0" signal that has been converted into a BCD (binary coded decimal) signal by the keyboard input circuit 5 is stored in the shift register 2c at the timing of D1W10T8φ1 shown in FIG. 4. At the timing of pulse φ1 shown in FIG. 4 the output of the dynamic shift register 3 is disabled so that it is possible to write signal "1, 0, 0, 0" into shift register 2c by merely enabling the transfer gate circuit TG-1 at the timing of D1W10T8φ1. Signal "8" that is signal "1, 0, 0, 0" is stored in the first digit. The latch circuit 6 operates to latch the data at the timing of W10T8φ2 shown in FIG. 4. Accordingly, the signal "1, 0, 0, 0" appears on the output of the latch circuit 6 while the digit pulse D1 is being produced and this output is converted into a 7 segment driving signal by a decoder 7 so as to drive the display unit 16 whereby "8" is displayed on the first digit (least significant digit). When a numeral "2" key of the keyboard 4 is depressed, just prior to the writing of the signal "2" or "0, 0, 1, 0" into the shift register 2c, signal "8" that is "1, 0, 0, 0" that has been written by the transfer circuit 8 will be written into the shift register 2d. Since shift register 2d advances one digit than shift register 2c the timing D1 shown in FIG. 4 for shift register 2c corresponds to the timing D2 for shift register 2d. In other words, signal "8" on the first digit will be transferred to the second digit D2. Thereafter signal "2" is stored and displayed as "0082". In the same manner, when the last numeral 5 is written in the keyboard 4 signals "8" and "2" will be transferred to digits D3 and D2 respectively through the transfer circuit so that numeral "5" is stored in D1 thus displaying "0825" showing that the desired numerals (frequency) have been stored in the shift register 3. Each stored numeral appears at the shift register 2c at the timing of timing pulse W10.

The latch circuit 9 shown in FIG. 1 operates to convert the digit serial data from the latch circuit 6 into parallel signals to form an input to the frequency synthesizer 10 that designates the frequency thereof. As has been described above all data from the keyboard 4 are assumed to be stored in memory position corresponding to word pulse W10 (hereinafter referred to as W10 memory position), but there are other nine W1 to W9 memory positions corresponding to pulse W1 through W9. Thus it will be clear that the data can be stored in any one of the memory positions. For example, a case wherein the data (representing the presently displayed frequency and the presently received signal) stored in the W10 memory position is to be transferred to the W3 memory position will be described as follows. For the purpose of preparing the memory position to store the data numeral "3" is sent from the keyboard 4 while an operating button (STO button) is depressed so that signal "3" will not be written into the shift register 2c but instead turns ON the memory circuit 11 constituted by a transfer gate circuit TG-2 at the timing of W3T6φ1 shown in FIG. 4. Since the data which have been stored in the W10 memory position are held by the latch circuit 6 for respective digits during an interval of corresponding to word pulses W0 to W9 shown in FIG. 4, it is possible to readily transfer all data in the W10 memory position for respective digits to the W3 memory position. At the timing of W3T8φ1, the W3 memory position appears at the shift register 2c.

The data stored in the shift register 3 is read out in the following manner. To read out the data in W3 memory position in the shift register 3, for example, the flip-flop 26 is switched to the recall mode. More particularly, after depressing a recall button RCL, numeral "3" is written in the keyboard 4. Then signal "3" drives the latch circuit 6 with the timing of W3T8φ2 shown in FIG. 4 instead of being stored in the shift register 2c. Latch circuit 6 is repeatedly driven at the timing of W10T8φ2, but now the timing of W3T8φ2 is added, with the result that the data for respective digits are read out of the W3 memory position at the timing of W3T8φ2. The refresh circuit 12 functions to write data at the timing of W10T4φ1 and apply the data to the shift register Sr-2 at the timing of W10T8φ1. Since the timing of W10T8φ1 corresponds to the trailing edges of the digit pulses and the timing of W1T8φ1 also represent the leading edges of the digit pulses and the timings of the shift registers 2c and 2d are different by one digit the refresh circuit 12 operates to write the data in the W3 memory position into the W10 memory position for each digit. Thus, at substantially the same time when the data is read out from the W3 memory position, the data in the W10 memory position is transferred to the latch circuit 6. Thus, the data in the W3 memory position is read, displayed and received. In the read mode, the refresh circuit 12 operates to repeatedly write the presently received frequency (that is the displayed frequency) into the W10 memory position. This means that the circuit 12 performs a refreshing operation.

The shift register 14 to which a carry output of the adder 13 may be added as shown in FIG. 1 functions to feed back to its input the output of the shift register 14 which has been carried up. In FIG. 1, terminal 15 shows an addition input.

Where it is desired to manually shift the receiving frequency, for example, a single pulse is applied to the addition input terminal 15 at the timing of D5W0T1 as shown in FIG. 4 thereby carrying up one digit the least significant digit. Since this timing D5W0T1 utilizes point R shown in FIG. 1 as the reference point at the actual position of insertion of the adder 13, 1 is added to the least significant digit data of the timing D1W1. Where a decimal carry up is made, the input to the shift register 2a is forcibly changed to "0" by using a gate circuit for example. The detection of the decimal carry up is done by the output from the shift register 2c. Where a subtraction operation is to be made by the successive shifting a signal "1111" is applied to the addition input terminal 15 thereby ignoring the binary carry up whereas a signal "0" that is "1001" is applied to the input of the shift register 2a in accordance with the decimal carry up. Where a timing pulse is applied to the addition input terminal 15 at such timing that the addition capability is imparted to a specific word the adder will have a clock function. Where the display circuit 16 has four digits as in this example pulses are applied to the addition input terminal 15 at a rate of one pulse per minute to provide for the output from the shift register 2c the detection functions of "10" that is "1010", "6" that is "0110" and "12" that is "1100", thereby detecting and carrying at the timings of T8 and T1 as shown in FIG. 4, thereby advancing D1 by 10 steps, D2 by 6 steps and D3 by 12 steps. Where no pulse is applied to the addition input terminal 15, the data in the memory device will be retained without any change, so that the memory device can be used to store other frequencies even when the clock function is not provided.

Figure 6:
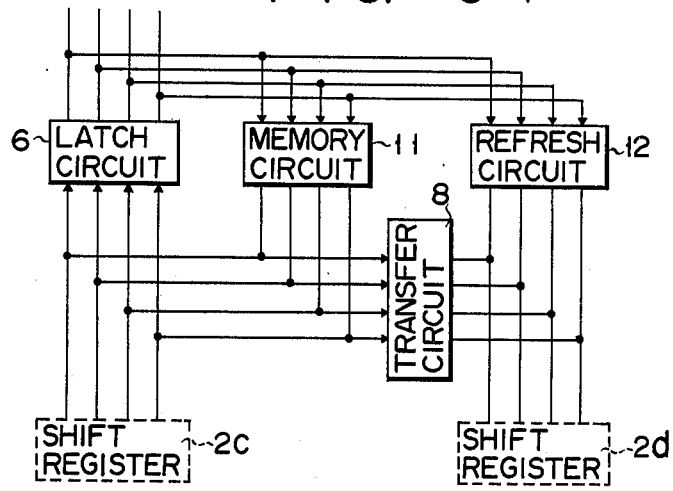
FIG. 6 is a partial block diagram showing a modification of the circuit shown in FIG. 1.

In the embodiment shown in FIG. 1, although the transfer circuit 8 is connected in parallel with the refresh circuit 12, it is also possible to connect the transfer circuit 8 directly across shift registers 2c and 2d without passing through latch circuit 6, as shown in FIG. 6. The construction and function of the remaining circuit elements are the same as those of the embodiment shown in FIG. 1.

A logical circuit such as a shift register that processes BCD (binary coded decimal) data is required to be provided with at least four bits for processing 1 digit of the decimal numerals 0 through 9 and such circuit can also assume the decimal numerals 0 to 15. Under the normal condition, since such four bit logical circuit is controlled to be used in the range of 0 to 9 of the decimal numerals there is no serious problem. However during such transient condition as the closure of a source switch the control described above is not definite so that there is a probability of assuming a value of 10 to 15.

Figure 7:
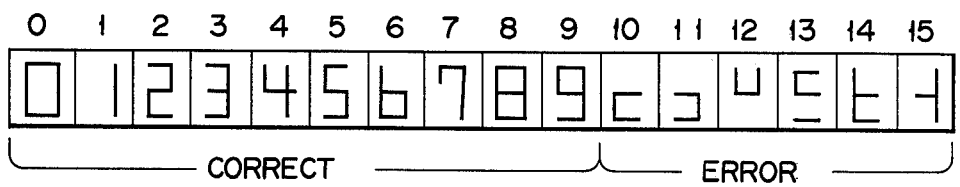
FIG. 7 is a diagram showing correct and erroneous displays of numerals.

Under these conditions, the digital display unit would not display the normal values of 0 to 9 but displays an erroneous numerals that can not be judged, as shown in FIG. 7.

Figure 8:
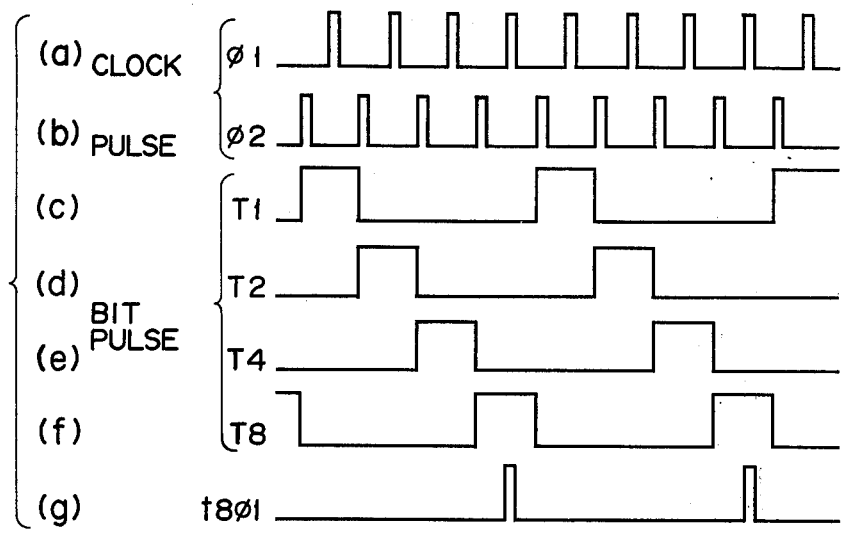
FIG. 8 shows waveforms of various pulses useful to explain the operation of the circuit for preventing the misoperation of the display unit.

In the embodiment shown in FIG. 1 a circuit E for preventing such erroneous display comprises two field effect transistors FET1 and FET2 serially connected between the first bit (A8) position of the shift register 2d in the dynamic shift register 3 and the ground, and the other field effect transistor FET3 connected between the common juncture between field effect transistors FET1 and FET2 and the ground. The circuit is constructed to apply a timing pulse T8φ1 to the gate electrode of the field effect transistor FET1 and signals A4 and A2 at the second and third bits respectively of the shift register 2d upon the gate electrodes of the field effect transistors FET2 and FET3. When signal A2 is at the "1" level, the field effect transistor FET3 turns ON to ground or short circuit signal A8 whereas the field effect transistor FET2 turns ON when the signal A4 is at the "1" level thereby grounding or short circuiting signal A8. Although it is necessary to turn ON the field effect transistor FET1 for grounding or short circuiting signal A8, the timing at which the field effect transistor FET1 turns ON should be limited to a condition under which a control pulse T8φ1 (FIG. 8(g)) presents which is in synchronism with the bit pulse t4 (FIG. 8(e)), that is when signal A8 is at a high impedance state. Such grounding and short circuiting operation corresponds to the conversion "1" at the fourth digit to "0" in accordance with the logical sum of the "1" levels of the binary second and third digits so that it is possible to correct the decimal numerals 10 to 15 shown in FIG. 9(a) which shows the correspondence between decimal numerals and the binary code digits to apparent decimal numerals 2 to 7 shown in FIG. 9(b) without any action when the decimal numerals are 0 to 9. In this manner, an excellent digital device can be provided capable of preventing misdisplay and misoperation under a transient condition illustrated by FIG. 7.

As has been described hereinabove, the logical sum of the second, third and fourth digits of the binary data is determined directly or indirectly for detecting the corresponding value of decimal numerals 10 to 15 thereby converting the BCD data into corresponding decimal numerals 0 to 9. But since single means is used to indirectly obtain the logical sum of the fourth, third and second digits of the binary numeral and to convert the logical sum it is possible to accurately prevent misdisplay and misoperation with a greatly simplified circuit construction.

Although the foregoing description relates to the display of one digit of a decimal numeral it is also possible to display a plurality of digits of a decimal numeral. If desired, only a specific digit may have more than 10 steps, for example, 12 steps.

In the example shown in FIG. 1, where AC driven display elements such as liquid crystal elements are used in the display unit 16, the polarity of the digit selection signal reverses at each one cycle so that it is not suitable to use such digit selection signal in the keyboard input circuit.

FIGS. 10 and 11 show one example of the keyboard input device having a small number of wirings but capable of accomodating many key inputs by using digit selection signals for driving AC driving type display elements. For the sake of clarity of the description, the number of display digit is set as four digits. More particularly, the keyboard 4 shown in FIG. 10 comprises a plurality of keys 1 to 9 and A and B the contacts thereof being connected in a matrix. To a plurality of input lines of the keyboard 4 are applied digit selection signals D1 through D4 shown in FIG. 11. These digit selection signals are supplied from the driving circuit 16a for the AC driven type display unit 16 and their polarities reverse at each cycle. Where a dynamic driving circuit superposed with alternating current is used as the driving circuit for liquid crystal display elements a pulse having a frequency of several KHz is superposed upon the digit selection signals D1 through D4. A plurality of output signals α, β and γ from the keyboard 4 are applied to a gate circuit 60 which is controlled by a frame signal D0 (see D0 shown in FIG. 11) generated by the driving circuit for providing the AC driving for the display elements. During an interval in which signal D is at the "0" level the gate circuit 60 is closed to prevent the passage of outputs α, β and γ whereas in the other interval in which signal DO is at the "1" level the gate circuit is enabled to apply the outputs α, β and γ to the keyboard input circuit 5 thus operating the same. To the keyboard input circuit 5 is applied a timing pulse Dt that designates the operating timing of the circuit FF-1 in FIG. 2 at a timing of WOT8φ1 in the space between superposed pulses of the digit selection signals D1 through D4 as shown by Dt in FIG. 11.

Assume now that key 5 is depressed during an interval shown in FIG. 11, the output signal β and the output signal β' from the input gate circuit 60 corresponding to key 5 are changed to β and β' respectively as shown in FIG. 11 thereby avoiding the effect of the polarity reversal of the digit selection signals D1 through D4.

Timing pulse Dt can be readily formed so long as the system is a digital system operated by a clock pulse. The keyboard input device described above is especially suitable for a digital system fabricated with large scale integrated circuits. Further, the keyboard input device described above can also use digit selection signals utilized to drive conventional DC driven type display elements.

FIGS. 12 and 13 show an excellent display unit driving circuit which can be fabricated with LSIs and can be used either for DC driving or AC driving system for the display unit 16 shown in FIG. 1.

More particularly, as shown in FIG. 12, BCD segment selection input signals A, B, C and D are decoded into 7 segment signals a through g by a BCD-7 segment decoder 70 and the 7 segment signals are applied to the gate electrodes of corresponding transfer gate circuits $TG_S11$, $TG_S12$ ... $TG_S71$ and $TG_S72$, directly or through inverters I11 through I17, two transfer gate circuits being provided for each segment. In the same manner, digit selection signals d1 through d4 are applied to the gate terminals of respective transfer gate circuits $TG_D11$, $TG_D12$ ... $TG_D41$, and $TG_D42$, directly or via inverters I21 through I24. Two gate circuits are provided for each digit. The output lines I and II of a LED/LCD switching circuit 11 (to be described later) are connected to the inputs of the transfer gate circuits $TG_S11$ through $TG_S72$ via inverters I31 and I32, respectively, while the input terminals of the transfer gate circuits $TG_D11$ through $TG_D42$ are connected directly to the output lines I and II2. The output terminals of the transfer gate circuits are connected in common for respective digits, and the common output terminals of the transfer gate circuits $TG_S11$ through $TG_S72$ are connected to corresponding segment selection signal output terminals S1 through S7 respectively, whereas the common output terminals of the transfer gate circuits $TG_D11$ through $TG_D42$ are connected to digit selection signal output terminals D1 through D4, respectively. The LED/LCD switching circuit 71 comprises an exclusive OR gate circuit 72 that reverses the phases of the low and high frequency signals respectively applied to a low frequency signal input terminal FL and a high frequency input terminal FH, a negative logical AND gate circuit 73 for applying the reversed signal to the output line II, and a negative logic OR gate circuit 74 for applying the low frequency signal applied to the terminal FL to the output line I. The gate circuits 73 and 74 for energizing the output lines I and II are controlled by a LED/LCD switching signal applied to an input terminal LED/LCD.

In the case of the LED driving mode a switching signal at level "1" is applied to the input terminal LED/LCD for maintaining the gate circuits 73 and 74 for the output lines I and II of the LED/LCD switching circuit 71 at the enabled and disenabled conditions respectively thereby preventing the reversed signals of the low and high frequency signals FL and FH from appearing on the output lines I and II. Under these conditions, the output line I is maintained at the "1" level while the output line II at the "0" level. Consequently, in the case of the LED driving mode, the BCD segment selection input signal and the digit selection input signal are produced on the output terminals S1 through S7 for the segment selection signal and on the output terminals D1 through D4 for the digit selection signal. In this case, the BCD segment selection input signal is decoded into a 7 segment signal by the decoder 70. Assume now that each one of the digit selection input signals comprises a time division signal as shown in FIGS. 13(c) through 13(f), digit selection signals D1 through D4 can be obtained through upper transfer gates $TG_D11$ through $TG_D41$ as shown in FIGS. 13(m) through 13(p) at the same timings as those shown in FIGS. 13(c) through 13(f). In the example shown in FIG. 13, signal SD2 shown in FIG. 13(l) is taken as one example of the segment signal for explaining the manner of selection by the timing action of the digit selection signal D2 alone. FIG. 13(r) shows a signal D2-SD2 which is actually applied upon the LED display element. As can be noted from the description just above, in the case of the LED driving mode, the waveform becomes a conventional dynamic (direct current) driving waveform.

Considering the LCD driving mode, a "0" level switching signal is applied to the input terminal of the LED/LCD switching signal for applying reversed signals of the low and high frequency signals on the output lines I and II in a manner to be described later. With regard to the low and high frequency signals FL and FH, the frequency of the low frequency signal FL is selected to be about 80 to 50 Hz as shown in FIGS. 13(a) and 13(b), which has a period about twice of the repetition period of the digit signal d1 through d4. On the other hand, the frequency of the high frequency signal FH is selected to be higher than 2 KHz or more to which the liquid crystal elements can not respond, although different more or less depending upon the type of the liquid crystal elements. Since liquid crystal elements respond to the high frequency signal having such high frequencies at a mean level it is possible to equivalently convert a binary signal into a multi-value signal by varying the duty cycle of the high frequency signal. Such measure is utilized as the so-called AC superposing method, one of the dynamic driving systems of liquid crystal display elements. The mean level which is selected to be about one-third of the peak is shown by dotted lines in the FH curve shown in FIG. 13(a). The phases of the high and low frequency signals FH and FL are reversed by the exclusive OR gate circuit 72 of the LED/LCD switching circuit 11 and then applied to the output line II via the negative logical AND gate circuit 19 and to the output line I via the negative logical OR gate circuit 14. Transfer gate circuits $TG_S11$ Through $TG_S72$ and $TG_D11$ through $TG_D42$ are gate controlled in accordance with the BCD segment selection input signal (which has been decoded into a 7 segment signal by decoder 10) and the digit selection input signal. In the case of the LCD driving mode, each one of the signals S1 through S7 and D1 through D4 utilizes the positive and negative phases of the high and low frequency signals FH and FL as the respective segment selection signals and the digit selection signals. In this case the digit selection signals D1 through D4 are shown by FIGS. 13(g) through 13(j) and the segment selection signal, for example SD2 is shown by FIG. 13(k). Signal SD2 is rendered selectable state by only digit signal D2. The term selectable state means a state in which a signal is applied across the electrodes such that the liquid crystal becomes displayable condition due to clouding. FIG. 13(l) shows the waveform (in mean value) of the voltage D2-SD2 actually applied to the liquid crystal element. As can be noted from this waveform selection is made by AC driving voltage not containing any DC component (in this case at the timing of D2). As shown, at the time of selection, full voltage (the peak value) is impressed across the electrodes of the liquid crystal element for providing a display. But during the non-selection period since a voltage of only one-third of the total voltage is impressed across the electrodes no display is made if the threshold voltage of the liquid crystal element were selected between the full voltage and one-third thereof, for example two-thirds. Where the mean level of the high frequency signal FH is selected to be one-third of the full voltage (this can be accomplished by selecting a duty cycle of 33%) it is possible to make maximum the voltage difference at the time of ON and OFF. This method is called a ⅓ bias method. Even though the duty cycle is selected to be within a range of from 25 to 50%, there is no practical problem although the threshold voltage should be set more strictly.

It should be understood that the invention is not limited to a driving circuit commonly utilized for LED and LCD and that the driving circuit of this invention can be used for any DC driving type display device (LED, phosphor display device and gas discharge tube type display device) and AC driving type display device (LCD and plasma display device).

FIGS. 14 and 15 show connection diagrams of a modified display unit wherein a display unit having a predetermined number of digits is used to digitally display the received band frequency and the control wire of an idle segment is used to display the received band as well as the frequency unit.

Considering now the maximum number of digits where respective band frequencies of MW, FM and SW are to be digitally displayed, the number of digits required for displaying the selected station is four for MW, three for FM and five for SW. Thus five digits for SW is the maximum. Since the maximum frequency of SW is 30,000 MHz, it is possible to limit the numerals necessary to provide five digit display to three thus displaying numerals 1, 2 and 3 alone.

The modification shown in FIG. 14 is based on this fact. There are provided 7 segment luminous diode display elements DIS1 through DIS5 by which five digits can be displayed. Of these display elements, in the display element DIS5 for the most significant digit segments $a$, $d$ and $g$ are constituted by a common segment $a5$, while the other segments $b5$, $c5$ and $e5$ are made independent. To display 1, segments $b5$ and $c5$ are driven. To display 2 segments $a5$, $b5$ and $e5$ are driven whereas to display 3 segments $a5$, $b5$ and $e5$ are driven. Thus, the display element DIS5 is constructed to display only, 1, 2 or 3. Then segments $d5$, $f5$ and $g5$ are idle. Segments $a1 \ldots a5$, $b1 \ldots b5$, $c1 \ldots c5$ and $e1 \ldots e5$ of respective display elements are connected in common respectively. Further, segments $d1 \ldots d4$, $f1 \ldots f4$ and $g1 \ldots g4$ of the display elements DIS1 through DIS4 are respectively connected in common. These commonly connected segments are connected to a drive circuit, not shown through common control wires $a$ through $g$. The drive circuit drives the control wire in synchronism with digit selection pulses D1 through D5 having timings as shown in FIG. 15 for displaying numerals of respective digits. In FIG. 14, BND1, BND2 and BND3 show display elements for receiving bands MW, FM and SW, respectively. Display element BND1 is connected to segments $d1$ through $d4$ through the control wire for segment $d5$ and the display element BND2 is connected to segments $f1$ through $f4$ through the control wire for segment $f5$. Similarly, the display element BND3 is connected to segments $g1$ through $g4$ through the control wire for segment $g5$. When the drive circuit drives any one of the control wires $d$, $f$ and $g$ in synchronism with the digit selection pulse D5 either one of the display elements BND1, BND2 and BND3 is operated. Display elements FUNT1 and FUNT2 are provided for displaying the frequency unit (0.1 MHz or KHz) of the received bands MW, FM and SW. The display elements FUNT1 is connected to the display element BND2 whereas display element FUNT2 is connected to the display elements BND1 and BND3. Thus concurrently with the operation of the display element BND2, display element FUNT1 is operated, as concurrently with the operation of the BND1 or BND3 the display element FUNT2 is operated. Thus, when digit selection pulse D5 corresponding to the display element 5 is applied and at the same time when the drive circuit drives either one of the control wire $a$, $f$ and $g$, the received band is displayed by either one of the display elements BND1, BND2 and BND3. At the same time, the frequency unit is displayed by corresponding display element FUNT1 or FUNT2.

The modified display unit shown in FIG. 14 operates as follows. To provide a four digit display of the MW band digit selection pulses D5 through D1 are applied to the display elements DIS5 through DIS1 at the timings as shown in FIG. 15, the drive circuit drives the control wire $d$ in synchronism with pulse D5. In response thereto, display element BND1 displays the band width while at the same time display element FUNT2 displays the frequency unit KHz. In the same manner, the drive circuit drives the control wires $a$ through $g$ in synchronism with other pulses D4 through D1, thus providing a four digit frequency display on display elements DIS1 through DIS4.

To provide a three-digit display of FM band, digit selection pulses D5 through D1 are applied to the display elements DIS5 through DIS1 at the timings as shown in FIG. 15 and the drive circuit drives the control wire $f$ in synchronism with pulse D5. Then, display element BND1 displays the FM band while at the same time display element FUNT1 displays the frequency unit × 0.1 MHz. Further, the drive circuit drives control wires $a$ through $g$ in synchronism with pulses D3 . . . D1 for providing a three-digit frequency display on display elements DIS3 through DIS1.

To provide a five-digit display of the SW band, the digit display pulses D5 through D1 are applied to display elements DIS5 through DIS1 at the timings as shown in FIG. 15 and the drive circuit drives the control wire g and one of the control wire a, b, c and e in synchronism with the digit pulse D5. Then in response to the drive of the control wire g, the display element BND3 displays the SW band while at the same time the display unit FUNT2 displays the frequency unit KHz. Either one of numerals 1, 2 and 3 is displayed by display element DIS5 dependent upon which one of the control wires a, b, c and e is driven. Remaining digits of the frequency are displayed by display elements DIS4 through DIS1 by suitably driving control wires a through g in synchronism with succeeding digit selection pulses D4 through D1.

What is claimed is:

1. A frequency synthesizer tuner comprising a dynamic shift register including first and second shift registers connected in a loop, wherein an information is written into and read out of said dynamic shift register and circulated therethrough by clock pulses, an output circuit including a display unit and a frequency synthesizer to which the information read out of said first shift register is supplied through a latch circuit, a memory circuit connected to the output of the latch circuit and having an output connected to the input of said latch circuit, a transfer circuit connected between said first and second shift registers for transferring the information from the first shift register into the second shift register for repeatedly supplying the information of said output circuit to said second shift register, a refresh circuit connected between said latch circuit and said second shift register, and a keyboard and a keyboard input circuit for applying an input information to said first shift register.

2. A frequency synthesizer tuner according to claim 1, wherein said transfer circuit is connected between said first and second shift registers through said latch circuit.

3. A frequency synthesizer tuner according to claim 1, wherein said transfer circuit is directly connected between said first and second shift registers.

4. A frequency synthesizer tuner according to claim 1, wherein said second shift register consists of four bit shift register and an erroneous display preventing circuit is coupled to said second shift register, said erroneous display preventing circuit comprising means for obtaining the logical sum of fourth digit with third and second digits of the second shift register to detect BCD values corresponding to the decimal number 10 to 15, and means for obtaining the inversed logical data of the fourth digit to convert the obtained BCD data to the corresponding decimal numbers 2 to 7.

5. A frequency synthesizer tuner according to claim 1, wherein said keyboard is supplied with a plurality of digit select signals for driving AC-driven display elements and, from which a prescribed signal in said digit select signals is selectively delivered in response to the operated key in a plurality of keys, and said keyboard input circuit further comprises an input gate circuit the gate of which is opened with the timing of the same polarity as that of the digit select signal to transfer the output signal from said keyboard to a keyboard input unit.

6. A frequency synthesizer tuner according to claim 1, wherein said display unit includes a display unit driving circuit operating in an AC-driven mode or a DC-driven mode both of which are driven by a segment select signal and a digit select signal, said display unit driving circuit comprising a gate circuit adapted to include a bias frequency signal component into said segment select input signal and said digit select input signal in the AC-driven mode and to prevent the bias frequency signal component in the DC-driven mode to deliver directly said segment select input signal and digit select input signal, thereby providing a universal display unit driving circuit for both of AC-driven and DC-driven modes.

7. A frequency synthesizer tuner according to claim 1, wherein said display unit comprises a display unit driving circuit in which a predetermined number of digits is used to digitally display the received band frequency and the control wires of idle segments are used to display at least one of the received band and the frequency units.

* * * * *

UNITED STATES PATENT AND TRADEMARK OFFICE
CERTIFICATE OF CORRECTION

PATENT NO. : 4,117,407
DATED : September 26, 1978
INVENTOR(S) : Kusakabe

It is certified that error appears in the above-identified patent and that said Letters Patent are hereby corrected as shown below:

Please correct the Priority Data to read as follows:

[30]   Apr. 30, 1975 [JP] Japan..........50-52337

Apr. 30, 1975 [JP] Japan..........50-52341

Apr. 30, 1975 [JP] Japan..........50-52346

Apr. 30, 1975 [JP] Japan..........50-52356

Jul. 18, 1975 [JP] Japan..........50-87919

*Signed and Sealed this*

*Eighteenth* Day of *September 1979*

[SEAL]

Attest:

LUTRELLE F. PARKER

*Attesting Officer*     *Acting Commissioner of Patents and Trademarks*